(12) United States Patent
Spory

(10) Patent No.: US 11,077,654 B2
(45) Date of Patent: Aug. 3, 2021

(54) CONDUCTIVE DIAMOND APPLICATION SYSTEM

(71) Applicant: Global Circuit Innovations Inc., Colorado Springs, CO (US)

(72) Inventor: Erick Merle Spory, Colorado Springs, CO (US)

(73) Assignee: Global Circuit Innovations Incorporated, Colorado Springs, CO (US)

( * ) Notice: Subject to any disclaimer, the term of this patent is extended or adjusted under 35 U.S.C. 154(b) by 0 days.

(21) Appl. No.: 16/844,027

(22) Filed: Apr. 9, 2020

(65) Prior Publication Data
US 2020/0230940 A1 Jul. 23, 2020

Related U.S. Application Data

(62) Division of application No. 15/792,275, filed on Oct. 24, 2017, now Pat. No. 10,654,259.

(51) Int. Cl.
| | | |
|---|---|---|
| B33Y 30/00 | (2015.01) | |
| C01B 32/26 | (2017.01) | |
| B24D 18/00 | (2006.01) | |
| H01B 1/04 | (2006.01) | |
| H01B 5/14 | (2006.01) | |
| H01B 13/00 | (2006.01) | |
| B29C 64/106 | (2017.01) | |
| B29C 64/141 | (2017.01) | |

(Continued)

(52) U.S. Cl.
CPC ............ *B33Y 30/00* (2014.12); *B24D 18/009* (2013.01); *B24D 18/0072* (2013.01); *B29C 64/106* (2017.08); *B29C 64/141* (2017.08); *B29C 64/20* (2017.08); *B33Y 10/00* (2014.12); *C01B 32/26* (2017.08); *H01B 1/04* (2013.01); *H01B 5/14* (2013.01); *H01B 13/0036* (2013.01); *H01L 21/02491* (2013.01); *H01L 21/02527* (2013.01); *H01L 21/02697* (2013.01); *B29K 2507/045* (2013.01); *C01B 32/25* (2017.08); *C22C 26/00* (2013.01); *H01L 21/02573* (2013.01)

(58) Field of Classification Search
None
See application file for complete search history.

(56) References Cited

U.S. PATENT DOCUMENTS

| | | | |
|---|---|---|---|
| 3,148,161 A | 9/1964 | Wentorf et al. | |
| 7,144,753 B2 * | 12/2006 | Swain | G01N 27/308 438/105 |

(Continued)

OTHER PUBLICATIONS

Yang, Nianjun, et al. "Conductive diamond: synthesis, properties, and electrochemical applications." Chemical Society Reviews 48.1 (Nov. 16, 2018): 157-204. (Year: 2018).*

(Continued)

*Primary Examiner* — Benjamin A Schiffman
(74) *Attorney, Agent, or Firm* — Thomas J. Lavan

(57) ABSTRACT

A system is provided. The system includes a 3D printer, which includes a first dispenser and a second dispenser. The first dispenser is configured to apply conductive material to a surface, and the second dispenser is configured to apply conductive diamonds to a surface. The conductive material includes a mixture of an elastomer and at least one of nickel and silver, and the conductive diamonds are between 1 and 10 microns in size.

10 Claims, 6 Drawing Sheets

(51) Int. Cl.
*B29C 64/20* (2017.01)
*B33Y 10/00* (2015.01)
*H01L 21/02* (2006.01)
*C01B 32/25* (2017.01)
*C22C 26/00* (2006.01)
*B29K 507/04* (2006.01)

(56) References Cited

U.S. PATENT DOCUMENTS

| | | | |
|---|---|---|---|
| 8,226,922 B2 | 7/2012 | Sumiya | |
| 9,156,058 B2* | 10/2015 | Brandl | B32B 5/16 |
| 9,487,446 B2* | 11/2016 | Sato | C01B 32/25 |
| 9,487,447 B2* | 11/2016 | Sato | C04B 35/6286 |
| 10,221,498 B2* | 3/2019 | Pascall | B23P 15/26 |
| 10,501,857 B2* | 12/2019 | Sundaram | B33Y 70/00 |
| 10,654,259 B2* | 5/2020 | Spory | H01L 21/02491 |
| 10,741,995 B2* | 8/2020 | Wolf | H01L 33/648 |
| 10,888,973 B2* | 1/2021 | Franke | B24B 1/04 |
| 2003/0039603 A1 | 2/2003 | Meng | |
| 2005/0019114 A1 | 2/2005 | Sung | |
| 2005/0110024 A1 | 5/2005 | Swain et al. | |
| 2015/0307404 A1 | 10/2015 | Sato et al. | |
| 2015/0315087 A1 | 11/2015 | Sato et al. | |

OTHER PUBLICATIONS

Wikipedia "Synthetic Diamonds", downloaded Sep. 17, 2016 from https://en.wikipedia.org/wiki/Synthetic_diamond.
Wikipedia "3D Printing", downloaded Jan. 12, 2015 from https://en.wikipedia.org/wiki/3D_Printing.

* cited by examiner

Fig. 1A Conductive Material Application
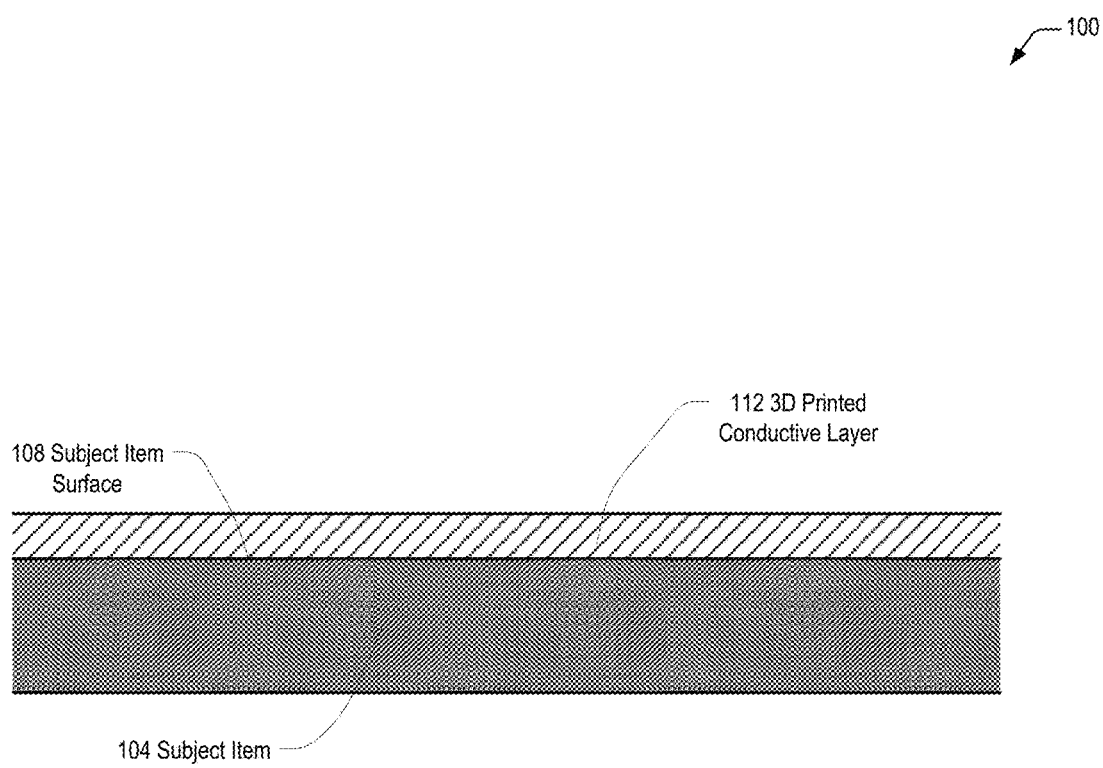

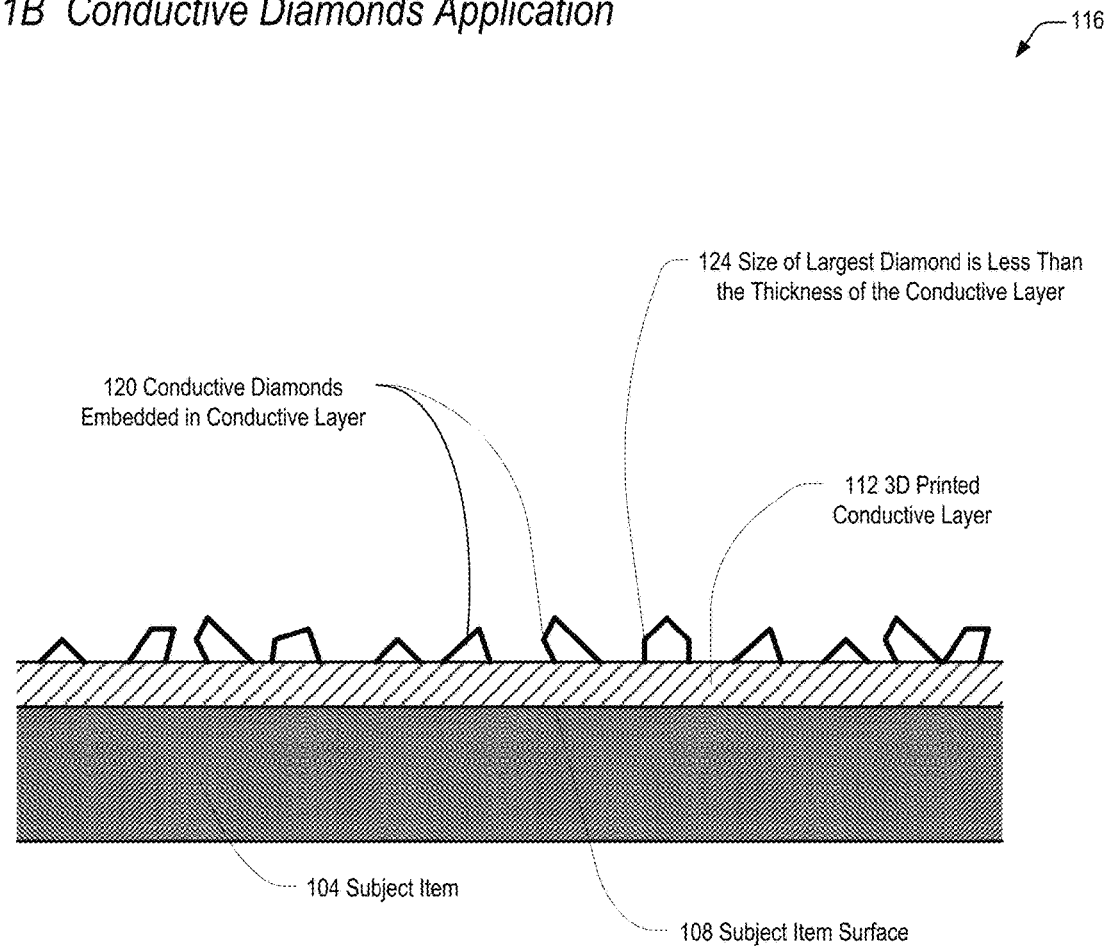
Fig. 1B Conductive Diamonds Application

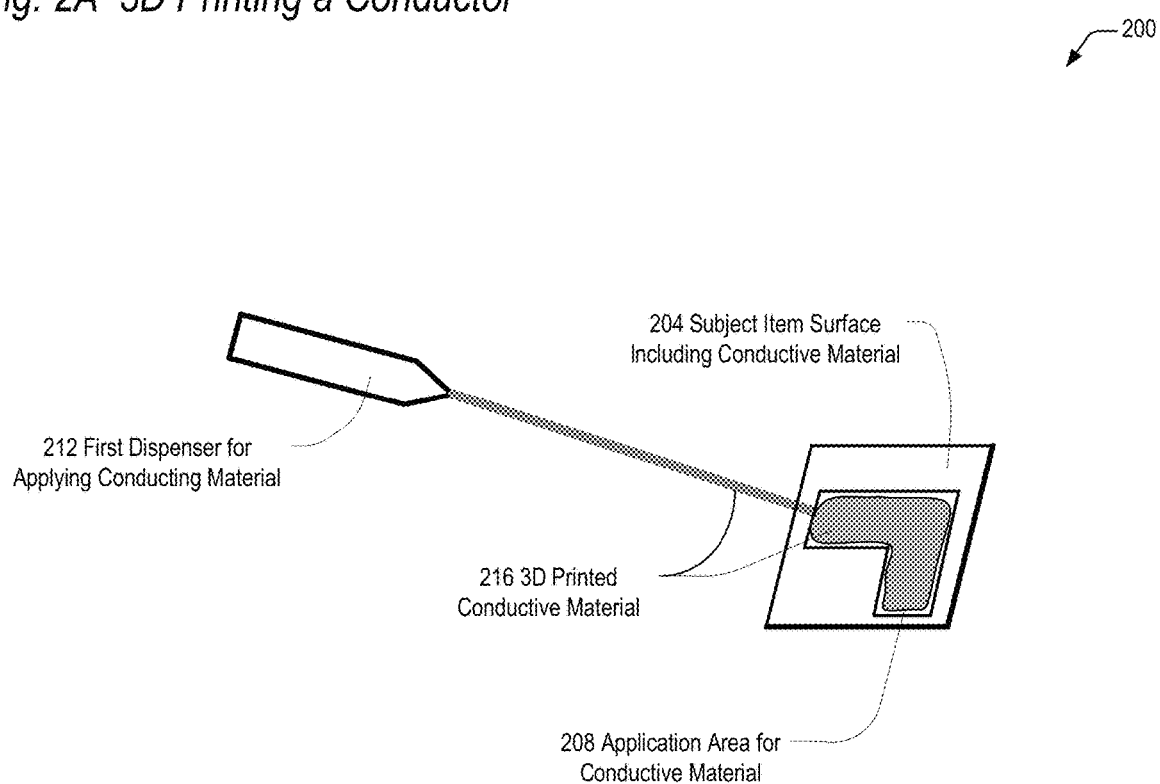
*Fig. 2A 3D Printing a Conductor*

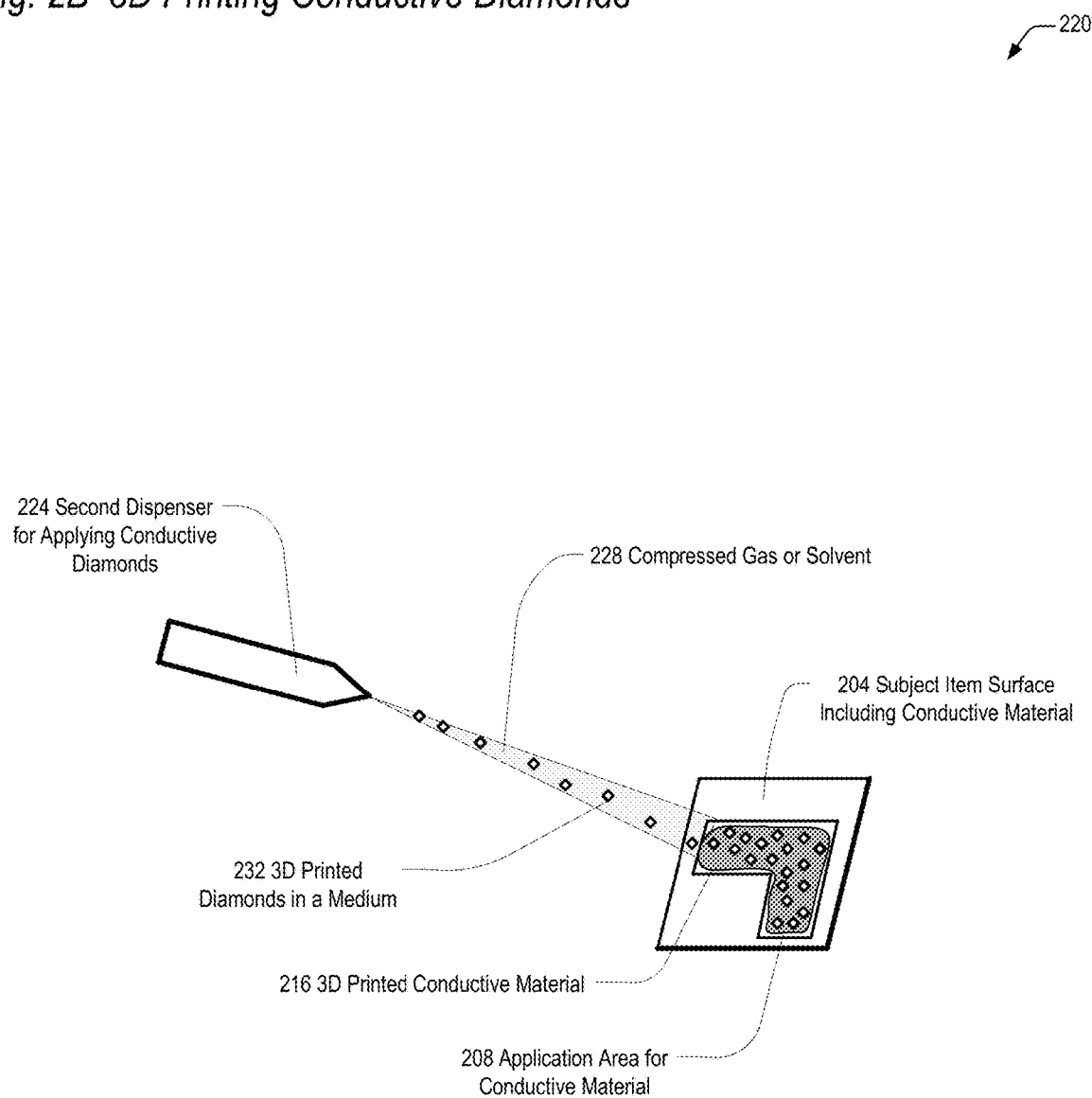
Fig. 2B 3D Printing Conductive Diamonds

*Fig. 2C Simultaneous 3D Printing Conductor and Conductive Diamonds*
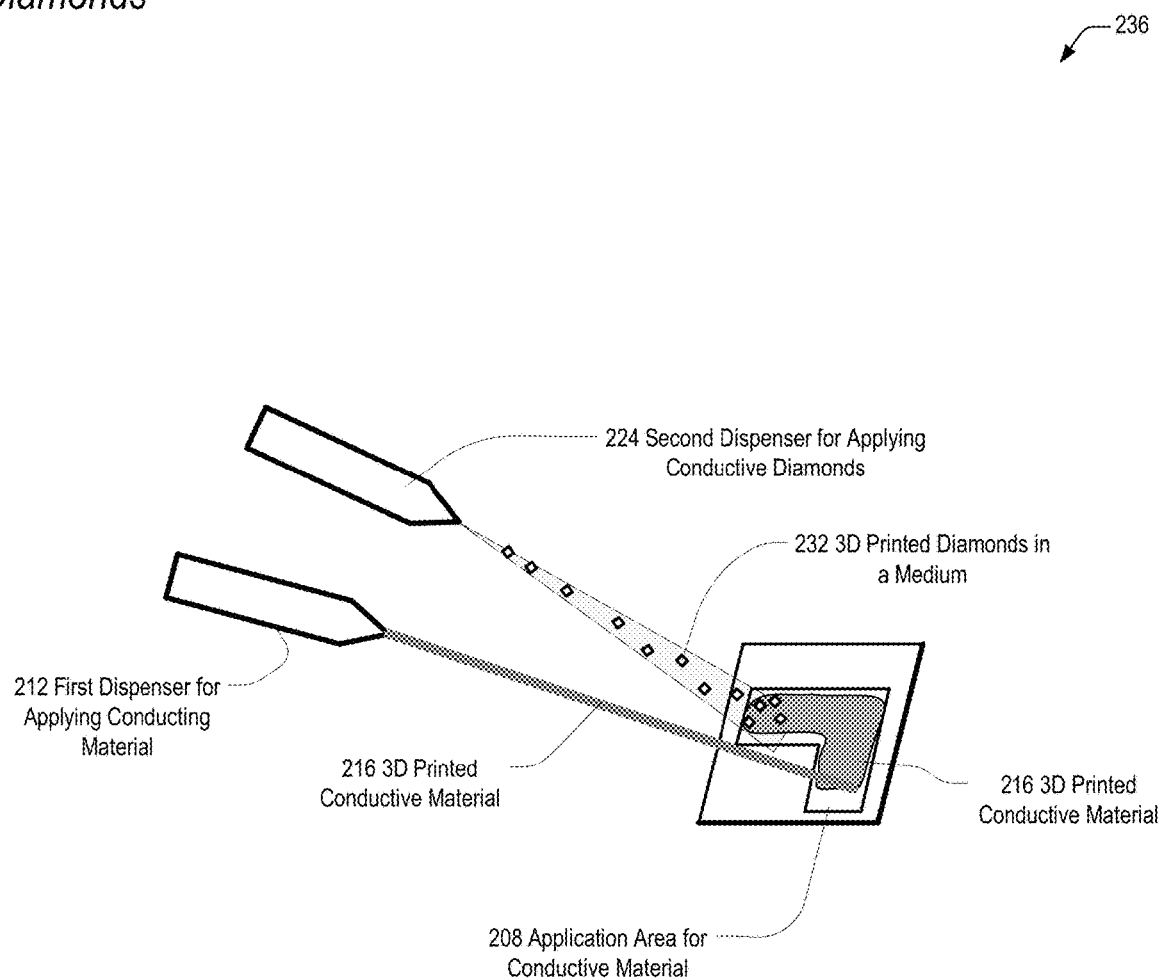

*Fig. 3A  Process for 3D Printing Material and Diamonds to Surface*
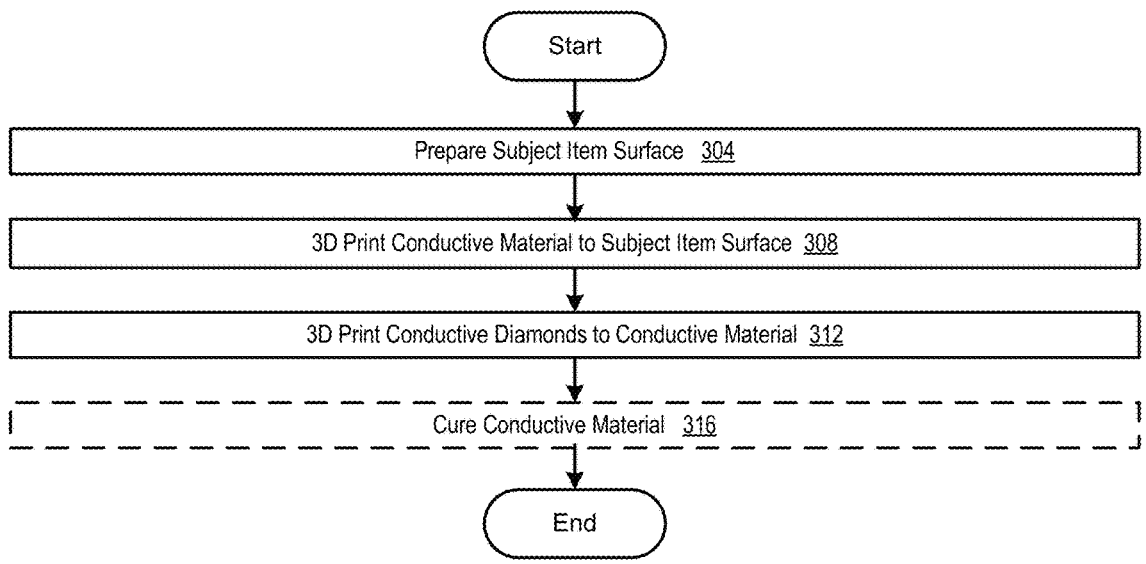
*Fig. 3B  Process for Simultaneously 3D Printing Material and Diamonds to Surface*
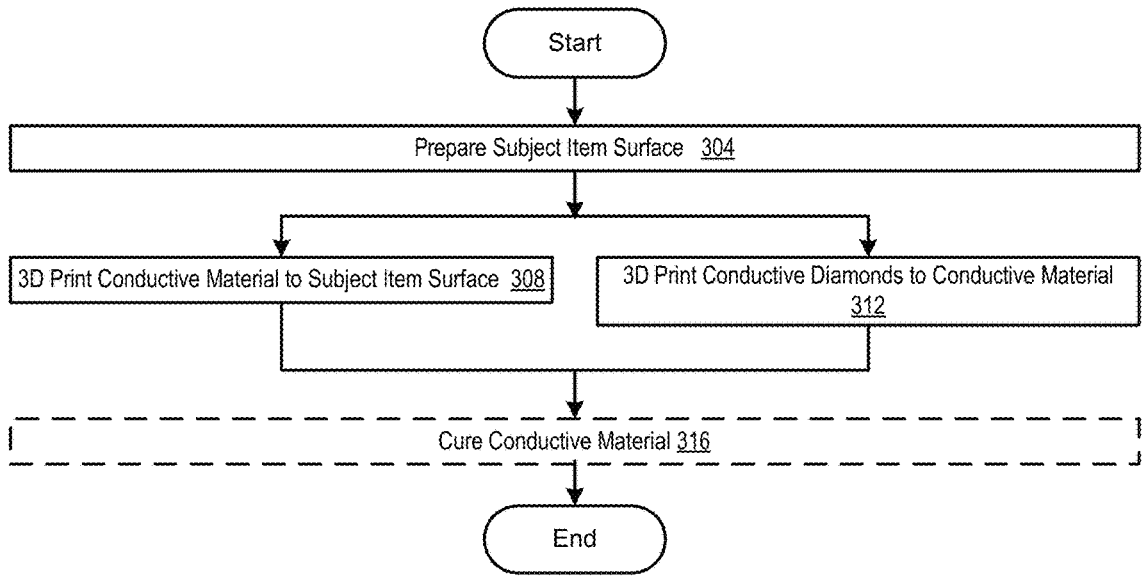

CONDUCTIVE DIAMOND APPLICATION SYSTEM

CROSS REFERENCE TO RELATED APPLICATION(S)

This application is a Divisional of pending non-Provisional U.S. application Ser. No. 15/792,275 filed Oct. 24, 2017, entitled CONDUCTIVE DIAMOND APPLICATION METHOD AND SYSTEM, which is hereby incorporated by reference for all purposes.

FIELD

The present invention is directed to application systems for conductive diamonds. In particular, the present invention is directed to 3D printing systems for conductive diamonds.

BACKGROUND

Naturally occurring diamonds are generally electrical insulators. However, with certain known doping and other treatment techniques, diamonds may become electrically conductive. Synthetic diamonds may be manufactured to have certain electrical conduction properties. Diamonds are often desired for applications where extreme hardness is desirable, including as abrasives.

SUMMARY

In accordance with embodiments of the present invention, a method is provided. The method includes preparing a surface to receive a 3D printed layer, 3D printing a conductive layer comprising a plurality of overlaid layers of conductive material to the surface, and 3D printing conductive diamonds to the conductive layer. Preparing the surface includes one or more of texturing the surface and chemically treating the surface. The texturing is performed in order to not adversely impact regularity of the surface and limit variations in the height from the surface of conductive diamonds. Chemically treating the surface reduces films or coatings that may impact adhesion between the surface and the conductive layer, without degrading the conductive layer.

In accordance with another embodiment of the present invention, a system is provided. The system includes a 3D printer, which includes a first dispenser for applying conducting material to a surface and a second dispenser for applying conductive diamonds to a surface. The conducting material includes a mixture of an elastomer and at least one of nickel and silver and conductive diamonds between 1 and 10 microns in size.

In accordance with yet another embodiment of the present invention, a system is provided. The system includes a file and a 3D printer. The file is configured to define one or more programmed areas of a surface and the 3D printer is configured to apply a conductive material and one or more conductive diamonds to the surface based on the file. The conductive material includes one or more of an elastomer, nickel, and silver.

An advantage of the present invention is it provides a low-cost method of applying diamonds to a surface. Diamonds have exceptional hardness and when conductive are able to make a strong electrical friction connection with a mating surface. Diamonds are able to penetrate oxides and other contaminants on the surface of components, and when conductive, to provide a low resistive connection between components in high speed signaling applications.

Another advantage of the present invention is it takes advantage of 3D printing processes to apply various insulating and conductive materials to a wide range of surfaces. 3D printing has evolved as a reliable way of applying solid and liquid materials to various surfaces. 3D printed conductive layers act as a binder to retain conductive diamonds in proximity to the surface of the conductive layer or layers.

Yet another advantage of the present invention is it provides the ability to apply conductive layers in well-controlled thicknesses. 3D printers apply conductive material in layers in order to build up the conductive layers to a predetermined thickness.

Additional features and advantages of embodiments of the present invention will become more readily apparent from the following description, particularly when taken together with the accompanying drawings.

BRIEF DESCRIPTION OF THE DRAWINGS

FIG. 1A is an illustration depicting conductive material application in accordance with embodiments of the present invention.

FIG. 1B is an illustration depicting conductive diamonds application in accordance with embodiments of the present invention.

FIG. 2A is an illustration depicting 3D printing a conductor in accordance with embodiments of the present invention.

FIG. 2B is an illustration depicting 3D printing conductive diamonds in accordance with embodiments of the present invention.

FIG. 2C is an illustration depicting simultaneous 3D printing conductor and conductive diamonds in accordance with embodiments of the present invention.

FIG. 3A is a flowchart illustrating a process for 3D printing material and diamonds to a surface in accordance with embodiments of the present invention.

FIG. 3B is a flowchart illustrating a process for simultaneously 3D printing material and diamonds to a surface in accordance with embodiments of the present invention.

DETAILED DESCRIPTION

The present invention is directed to methods and systems for applying conductive diamonds by 3D printing processes to a variety of objects. 3D printers apply liquid and solid materials in various forms and combinations. Although 3D printers may be best known for fabricating simple three-dimensional ornamental objects from sprayed polymer materials, other applications have emerged based on improvements in 3D printing technology and materials. Current 3D printers utilize extrusion deposition, granular material binding, lamination, photo polymerization, powder fed directed energy deposition, metal wire processes, and continuous liquid interface production. 3D printing processes are also known is additive manufacturing processes. 3D printers are now able to apply materials under computer control in sophisticated and increasingly fine pitched applications.

Previous application methods for applying conductive diamonds have involved component submersion in a hot bath with electroless Nickel. In addition to being slow and time consuming, Nickel can be difficult to work with and hard to control in small areas since it requires masks to prevent plating in specified areas. 3D printing conductive diamonds is significantly faster and does not need to involve masks or other preparatory steps other than possibly surface preparation to aid adhesion. The 3D printed layers and conductive diamonds are only applied to pre-programmed specific areas on the surface of a workpiece.

In addition to additively applying amorphous materials and compounds, 3D printers are able to apply discrete non-amorphous materials such as very small diamonds. Diamonds are useful in many industrial applications based on hardness, abrasives, and other unique characteristics. Although diamonds are naturally insulators, in some cases diamonds may be created or treated in order to have electrically conductive properties. When combined with conventional amorphous conductive materials, diamonds may provide a rougher surface with valuable abrasive qualities that facilitate electrical conduction. For example, by 3D printing an electrical connector shell with conductive diamonds embedded into a 3D printed amorphous conductive layer, in improved electrical connection to a mate of the shell may be provided. Conductive diamonds, because of sharpness and hardness, penetrate oxides, contaminants, and other high resistivity barriers between electrical components and therefore can provide improved electrical performance over applications not including 3D printed conductive diamonds.

In order to apply conductive diamonds by 3D printing processes, it is important to use diamonds within a range of sizes, or diameters. Conductive diamonds should be between 1 and 10 microns in size, and preferably 3-5 microns for better consistency and evenness in application using compressed gases or solvents. Larger diamonds than 10 microns may fall out of an aerosol quickly and therefore may not be evenly distributed.

Referring now to FIG. 1A, an illustration 100 depicting conductive material application in accordance with embodiments of the present invention is shown. The 3D printed conductive layer 112 adheres to the subject item surface 108, and acts as a binder for the application of conductive diamonds.

In one embodiment, the 3D printed conductive layer 112 includes an elastomer and at least one of nickel and silver. The elastomer may aid adhesion between the subject item surface 108 and the 3D printing conductive layer 112. In another embodiment, the 3D printed conductive layer 112 includes only nickel and/or silver. Metallic components of the 3D printed conductive layer 112 are applied by known processes including selective laser sintering. In yet another embodiment, the 3D printed conductive layer 112 includes electrically conductive polymer or polymers. Polymers may be easier to apply in some circumstances, and may have improved elastomeric properties over metallic compounds for retaining conductive diamonds.

Referring now to FIG. 1B, an illustration 116 depicting conductive diamonds application in accordance with embodiments of the present invention is shown. After the 3D printed conductive layer 112 is applied over the subject item surface 108, conductive diamonds 120 are applied by 3D printer and embedded in the 3D printed conductive layer 112. In one embodiment, the conductive diamonds 120 are applied by the 3D printer after the 3D printed conductive layer 112 is applied. In another embodiment, the conductive diamonds 120 are applied concurrently with the 3D printed conductive layer 112. This will depend on the curing time of the 3D printed conductive layer 112 and the ability of the conductive diamonds 120 to permanently "embed" in the surface of the 3D printed conductive layer 112.

In the preferred embodiment, the size of the conductive diamonds 124 determines the thickness of the 3D printed conductive layer 112. That is, the 3D printed conductive layer 112 has a thickness greater than the largest of the conductive diamonds 120. This may be important depending on the resistance of the 3D printed conductive layer 112 to pressure from the conductive diamonds 120 when the subject item 104 is mated to a mating surface, in order to prevent the conductive diamonds 120 from pushing through the 3D printed conductive layer 112 and making contact with the subject item surface 108.

Referring now to FIG. 2A, an illustration 200 depicting conductive material application in accordance with embodiments of the present invention is shown. In this embodiment, the 3D printed conductive layer 112 may be directly applied to the subject item surface including conductive material 204. A first dispenser for applying conductive material 212 of a 3D printer applies the conductive material 216 to a predefined application area for conductive material 208. The 3D printed conductive layer 112 is built up by the application of 3D printed conductive material 216 in layers until a desired predefined thickness has been achieved. Typically, the predefined area 208 is in a software file that controls operation of the 3D printer and directs the first dispenser 212 to apply the conductive material 216 to predefined thickness and in a predefined area 208. In one embodiment, the application area 208 defines one or more higher-wear areas that are intended to receive a thicker application of 3D printed conductive material 216 than other areas of the application area 208. It is important that the properties of the 3D printed conductive material 216, and potentially the surface treatment of the subject item surface 204, are compatible in order to maximize adhesion between the 3D printed conductive layer 112 and the subject item surface 108.

Referring now to FIG. 2B, an illustration 220 depicting conductive diamonds application in accordance with embodiments of the present invention is shown. After the 3D printed conductive layer 112 is applied over the subject item surface 108, conductive diamonds 120 are applied by 3D printer and embedded in the conductive layer 112. In one embodiment (FIG. 2C), a 3D printer applies the conductive diamonds 120 after the 3D printed conductive layer 112 is applied. In another embodiment (FIG. 2B), the conductive diamonds 120 are applied concurrently with the 3D printed conductive layer 112. This will depend on the curing time of the 3D printed conductive material 216 and the ability of the conductive diamonds 120 to permanently "embed" in the surface of the 3D printed conductive layer 112.

A second dispenser 224 for applying conductive diamonds mixed with a compressed gas or solvent 228 projects 3D printed diamonds in a medium 232 to an application area for conductive material 208. The medium includes compressed gas or solvent 228. Typically, the application area 208 is in a software file that controls operation of the 3D printer and directs the second dispenser 224 to apply the conductive material 216 to a predefined thickness and in a predefined area 208. In one embodiment, the application area 208 defines one or more higher-wear areas that are intended to receive a thicker application of 3D printed diamonds in a medium 232 than other areas of the application area 208.

In the preferred embodiment, the size of the conductive diamonds 124 determines the thickness of the 3D printed conductive layer 112. That is, the 3D printed conductive layer 112 has a thickness greater than the largest of the conductive diamonds 120. This may be important depending on the resistance of the 3D printed conductive layer 112 to pressure from the conductive diamonds 120 when the subject item 104 is mated to a mating surface, in order to prevent the conductive diamonds 120 from pushing through the 3D printed conductive layer 112 and making contact with the subject item surface 108.

Referring now to FIG. 2C, an illustration depicting simultaneous 3D printing conductor and conductive diamonds 236 in accordance with embodiments of the present invention is shown. In some embodiments, it may be desirable to simultaneously apply the 3D printed conductive material 216 and the 3D printed diamonds in a medium 232 concurrently. For example, if the 3D printed conductive material 216 sets up or cures quickly, it may be necessary to provide for concurrent application to ensure the conductive diamonds 120 are embedded in the surface of the 3D printed conductive material 216

Simultaneous application of conductive material 216 and conductive diamonds 120 requires two different dispensers operating at the same time. A first dispenser 212 applies the conductive material 216 while a second dispenser 224 applies the conductive diamonds in a medium 232, where the medium includes compressed gas or solvent 228. In a first embodiment, the first dispenser 212 "leads" the second dispenser 224 to apply the 3D printed conductive material 216 to the subject item surface 108 just before the conductive diamonds 120. In a second embodiment, the first dispenser 212 and the second dispenser 224 apply the 3D printed conductive material 216 and conductive diamonds 120 to the same areas 208 of the subject item surface 108 at the same time.

Referring now to FIG. 3A, a flowchart illustrating a process for 3D printing material and diamonds to a surface in accordance with embodiments of the present invention is shown. Flow begins at block 404.

At block 304, in all cases, it may be necessary to prepare the subject item surface 108 prior to 3D printing any of the layers 112 or conductive diamonds 120. Preparing the subject item surface 108 ensures that the 3D printed conductive layer 112 will securely adhere to the subject item surface 108 and not shift or separate. In one embodiment, the subject item surface 108 is mechanically textured in order to produce an irregular surface the layers 112 may adhere to. The aggressiveness of the texturing should be minimized in order that the texturing does not adversely impact the regularity of the subject matter surface 108 or variation in the eventual height of the conductive diamonds 120, relative to the subject matter surface 108. In other embodiments, the subject item surface 108 may be chemically treated in order to reduce films or coatings that may adversely impact adhesion with the layers 112. The chemicals used will depend on the nature of films or coatings that may be present as well as material properties of layers 112, and must be selected in order to not degrade the material of layers 112. Flow proceeds to block 308.

At block 308, a 3D printer applies conductive material 216 over the subject item surface 108. The conductive material 216 is built up in layers in order to achieve a desired thickness. The built-up thickness of the conductive material 216 may be uniform throughout an application area for conductive material 208, or have variable thickness within the application area for conductive material 208. Flow proceeds to block 312.

At block 312, the 3D printer applies conductive diamonds 120 over the conductive material 216. Where the conductive diamonds 120 are applied, preferably the conductive diamonds 120 are applied with a consistently even density. Flow proceeds to optional block 316.

At optional block 316, the conductive material 216 is cured. In one embodiment, heat is used to cure the conductive material 216. In another embodiment, infrared energy (IR) is used to cure the conductive material 216. In yet another embodiment, spray chemical compounds are used to cure the conductive material 216. Block 316 is optional since in some embodiments the conductive material 216 is self-curing and does not require the influence of a curing agent to set. Flow ends at optional block 316.

Referring now to FIG. 3B, a flowchart illustrating a process for simultaneously 3D printing material and diamonds to a surface in accordance with embodiments of the present invention is shown. Flow begins at block 304.

At block 304, in all cases, it may be necessary to prepare the subject item surface 108 prior to 3D printing any of the layers 112 or conductive diamonds 120. Preparing the subject item surface 108 ensures that the 3D printed conductive layer 112 will securely adhere to the subject item surface 108 and not shift or separate. In one embodiment, the subject item surface 108 is mechanically textured in order to produce an irregular surface the layers 112 may adhere to. The aggressiveness of the texturing should be minimized in order that the texturing does not adversely impact the regularity of the subject matter surface 108 or variation in the eventual height of the conductive diamonds 120. In other embodiments, the subject item surface 108 may be chemically treated in order to reduce films or coatings that may adversely impact adhesion with the layers 112. The chemicals used will depend on the nature of films or coatings that may be present as well as material properties of layers 112, and must be selected in order to not degrade the material of layers 112. Flow proceeds to blocks 308 and 312.

At block 308, a 3D printer applies conductive material 216 over the subject item surface 108. The conductive material 216 is built up in layers in order to achieve a desired thickness. The built-up thickness of the conductive material 216 may be uniform throughout an application area for conductive material 208, or have variable thickness within the application area for conductive material 208. Flow proceeds to block 312.

At block 312, simultaneous with the 3D printer applying the conductive material 216, the 3D printer applies conductive diamonds 120 over the conductive material 216. In one embodiment, the 3D printer applies the conductive material 216 just prior to applying the conductive diamonds 120. In another embodiment, the 3D printer applies the conductive material 216 to the same area 208 as the conductive diamonds 120, at the same time. Where the conductive diamonds 120 are applied, preferably the conductive diamonds 120 are applied with a consistently even density. Flow proceeds to optional block 316.

At optional block 316, the conductive material 216 is cured. In one embodiment, heat is used to cure the conductive material 216. In another embodiment, infrared energy (IR) is used to cure the conductive material 216. In yet another embodiment, spray chemical compounds are used to cure the conductive material 216. Block 316 is optional since in some embodiments the conductive material 216 is self-curing and does not require the influence of a curing agent to set. Flow ends at optional block 316.

Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

I claim:

1. A system, comprising:
a 3D printer, comprising:
a first dispenser, configured to apply conductive material to a surface;
a second dispenser, configured to apply conductive diamonds to a surface;
the conductive material comprising a mixture of an elastomer and at least one of nickel and silver; and
the conductive diamonds between 1 and 10 microns in size.

2. The system of claim 1, wherein the 3D printer applies the conductive material to the surface comprises the 3D printer configured to apply a plurality of successive layers of conductive material in order to build up a desired predetermined thickness of conductive material.

3. The system of claim 2, wherein a size of a largest diamond of the conductive diamonds is less than the predetermined thickness of the conductive material.

4. The system of claim 2, wherein the 3D printer is configured to apply the plurality of successive layers to an application area for conductive material predefined on the surface.

5. The system of claim 4, wherein at least one portion of less than all of the application area for conductive material receives a different predefined thickness of conductive material compared to a different portion of the application area for conductive material.

6. The system of claim 1, wherein the conductive material comprises a plurality of layers of conductive polymers.

7. The system of claim 1, wherein in response to the 3D printer applies the conductive layer and conductive diamonds, the conductive material is cured, wherein the second dispenser applies the conductive diamonds over the conductive material prior to the conductive material is cured.

8. The system of claim 1, wherein the second dispenser is configured to apply the conductive diamonds simultaneously to the first dispenser applies the conductive material.

9. The system of claim 1, wherein the 3D printer is configured to apply the conductive diamonds through the second dispenser with a compressed gas under pressure.

10. The system of claim 1, wherein the 3D printer is configured to apply the conductive diamonds through the second dispenser with a solvent in aerosol form.

* * * * *